United States Patent [19]

Fu et al.

[11] Patent Number: 5,612,915

[45] Date of Patent: Mar. 18, 1997

[54] CLAMP CIRCUIT FOR READ-ONLY-MEMORY DEVICES

[75] Inventors: Stephen Fu, Chung-Li; Hsin-Li Chen, Hsinchu Hsien, both of Taiwan

[73] Assignee: United Microelectronics Corporation, Hsinchu, Taiwan

[21] Appl. No.: 591,390

[22] Filed: Jan. 25, 1996

[51] Int. Cl.$^6$ .................................................. G11C 11/34
[52] U.S. Cl. ........................ 365/189.06; 365/94; 365/104
[58] Field of Search ........................ 365/104, 94, 189.06

*Primary Examiner*—David C. Nelms
*Assistant Examiner*—F. Niranjan
*Attorney, Agent, or Firm*—Ladas & Parry

[57] ABSTRACT

A clamp circuit for a read-only-memory (ROM) device provides clamp voltages which can uniformly compensate for the parasitic capacitance on ROM word lines and improve the performance of the ROM device. The clamp circuit includes an active load, a plurality of amplifiers and a transmission gate. The amplifiers have various trip voltages and are controlled by different decoding signals for providing various clamp voltages to different word lines in the ROM device. Each amplifier is composed of a NOR gate and a transistor. The amplifier trip voltages can be easily set to desired values when designing NOR gate layout patterns without additional complicated processes being introduced into the fabrication methodology of a semiconductor integrated circuit.

7 Claims, 5 Drawing Sheets

CLAMP CIRCUIT FOR READ-ONLY-MEMORY DEVICES

BACKGROUND OF THE INVENTION

1. Field of the Invention

The present invention relates to semiconductor integrated circuits, and more specifically, to a clamp circuit utilized in read-only-memory (ROM) devices.

2. Technical Background

A semiconductor ROM device is composed of a number of memory cells which are formed by intersecting a plurality of word lines and bit lines on a semiconductor substrate. As the on/off states of the memory cells have been determined in their manufacturing processes, the data stored therein will not fade away and can be read out by specific sensing circuits. Therefore, the ROM devices are provided for electronic instruments in which nonvolatile data storage is required, i.e., the data must be lossless even if no electrical power is supplied.

Among all ROM device structures, the so-called "flat-cell" ROM structure is the most popular one. Since the large-area which consumes field oxide layers can be eliminated from the flat-cell structure, the cell density can be greatly increased. FIG. 1 is a schematic diagram illustrating a flat-cell memory bank structure. The bank structure shown in FIG. 1 includes a number of word lines $W_{L1}$ through $W_{LN}$, sense-amplify signal lines SA1 and SA2, virtual ground lines VG1 and VG2, metal bit lines MBL1 through MBL3, and a memory cell array consisting of cells A–D and J–M etc. Moreover, in order to form a data read path to the memory cells, bank select lines $S_N$ and $S_{N+1}$ are provided for controlling transistor switches T1–T7.

The aforementioned ROM device has its word lines, bit lines and other signal lines applied with specific voltages to choose a memory cell in the memory cell array, and data is then read through the sensing circuit. For example, in order to readout the data stored in cell A, the voltage level of bank select line $S_N$ is high, $S_{N+1}$ is low, and virtual ground line VG1 is biased through a column control pass gate by low voltage source VSS. Therefore, transistor switches T1 and T4 are turned on and switches T3, T6 and T7 are turned off. Since virtual ground line VG2 is biased to a level equivalent to that of sense-amplify bit line SA1, transistor switches T2 and T5 are turned on but with very little current flow therethrough. Therefore, the read operation of the cell is not affected. Accordingly, the current amplitude of the data read path consisting of transistors T1, T4 and cell A can be sensed to determine the data stored in cell A.

The current in sense-amplify bit line SA1 can be read out, through metal bit line MBL2, by a sense amplifier, such as the conventional sense amplifier illustrated in FIG. 2A. However, if cells B and D are also turned on when cell A is accessed, parasitic capacitance C3, C4 and C5 of the bit line will share charges with capacitance C1 and C2, thus affecting the read operation of cell A. Therefore, a clamp circuit, such as that shown in FIG. 2B, has to connect with bit line MBL3 to provide a constant voltage and reducing the charge sharing effects of parasitic capacitance C3, C4 and C5.

Referring to FIG. 2B, the conventional clamp circuit includes active load MP2, NOR gate 20, NMOS transistor MN21, and another NMOS transistor MN22. Connected with active load MP2, transistor MN 21 is controlled by NOR gate 20. NOR gate 20 has two input ends. One is controlled by chip select signal CS for disabling the clamp operation, and the other is connected to the connection point of the two transistors MN21 and MN22. Transistor MN22 is a pass gate for providing voltage to bit line MBL3 under the control of column select signal YG.

In order to increase the area of metal contact windows, any two adjacent contacts of the metal bit lines and the sense-amplify bit lines (or virtual ground bit lines) are arranged at opposite ends of the memory bank. For example, referring to FIG. 1, since sense-amplify bit line SA1 and metal bit line MBL2 connect at the upper end of the bank, virtual ground line VG2 has to connect metal bit line MBL3 at the lower end of the bank. Moreover, since the sense-amplify bit lines and virtual ground bit lines are substantially diffusion regions, their effective resistance depends on the length of data path. Therefore, as two different cells in the same bank have different data paths, their corresponding effective resistance may also differ with respect to each other.

Referring to the reduced memory bank structure shown in FIG. 3, wherein a number of cells A, B, C, D, K and L are included. When bank select line $S_{N+1}$ has a high level voltage, word line $W_{L1}$ is high, virtual ground bit line VG1 connects to a low voltage source VSS, and VG2 connects to the clamp circuit of FIG. 2B, a data path to cell B is formed. If cell C is also turned on, charges in parasitic capacitance C4 must be balanced by the clamp circuit through virtual ground line VG2, especially when cell B is a normally off cell. Alternatively, when word line $W_{L1}$ becomes low and word line $W_{L32}$ becomes high, another data path to cell K is formed. If cell L is also turned on, the charge sharing effect of capacitance C4 has to be eliminated by the clamp circuit through VG2. However, since cells C and L locate at opposite ends of the memory bank, they have different path lengths to the clamp circuit. Therefore, the voltages are provided from the clamp circuit to offset the capacitance variation due to the variation of effective resistance in virtual ground line VG2. Since the parasitic capacitance cannot be uniformly offset, the voltage variation of the clamp circuit affects the performance of the ROM device.

SUMMARY OF THE INVENTION

Accordingly, the present invention provides a clamp circuit which can generate various voltage levels to minimize the voltage variation caused by the effective resistance of the data paths.

The clamp circuit for a ROM device of the present invention includes an active load, a plurality of amplifiers and a transmission gate. The amplifiers are provided with various trip voltages and are controlled by different decoding signals for providing various clamp voltages to different word lines. Each amplifier is composed of a NOR gate and a transistor. The trip voltages of the amplifiers can be easily adjusted to desired values by the design of NOR gate layout patterns without additional complicated process being introduced into the fabrication of a semiconductor integrated circuit. Since the parasitic capacitance on the word lines can be uniformly offset by the clamp voltages, the performance of the ROM device can be improved.

BRIEF DESCRIPTION OF THE DRAWINGS

The above features of the present invention will become more apparent by reference to the following descriptions in connection with the accompanying drawings, wherein.

DETAILED DESCRIPTION OF THE PREFERRED EMBODIMENT

Figure 1:
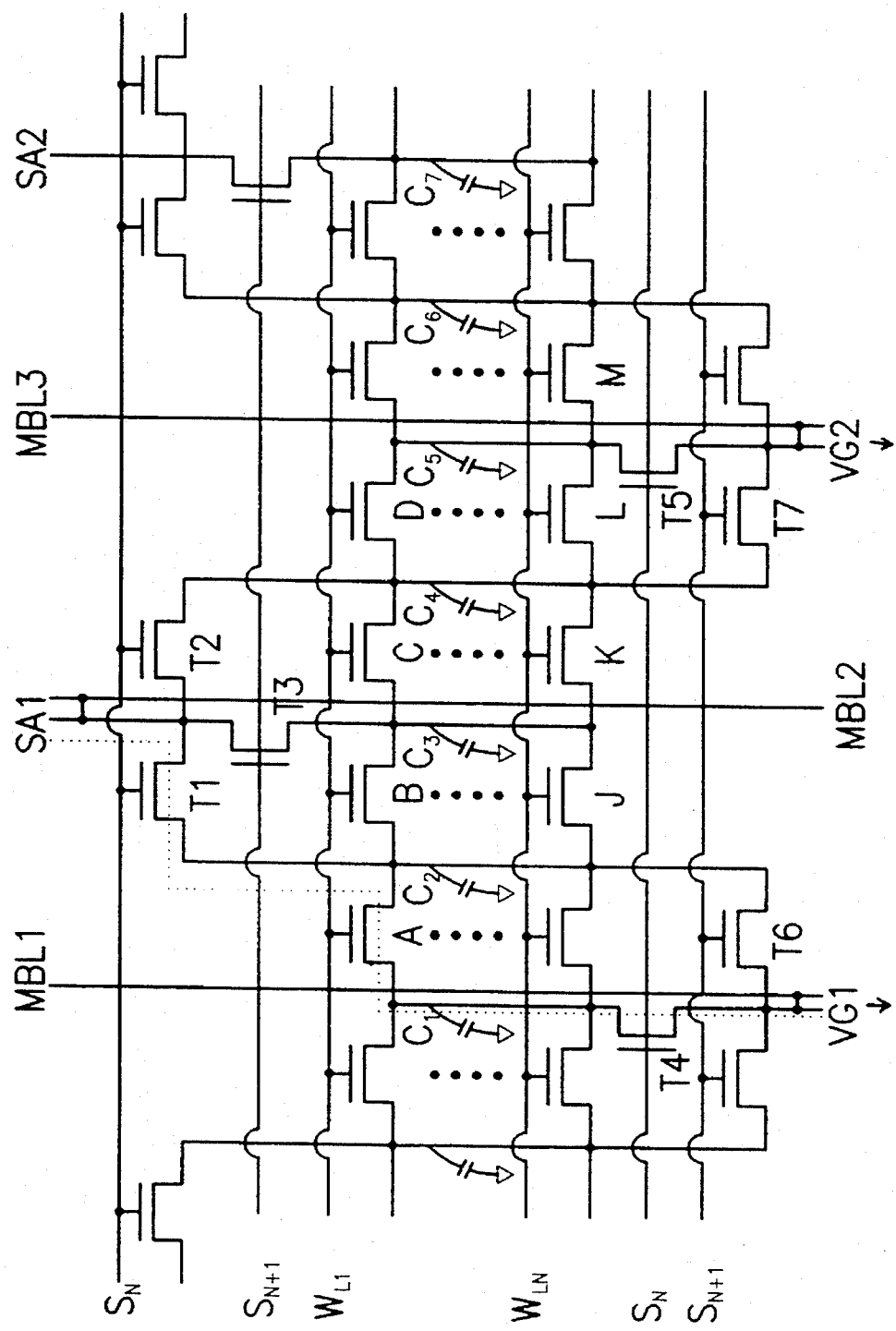
FIG. 1 is a schematic diagram of a conventional ROM bank circuit structure.
Figure 2B:
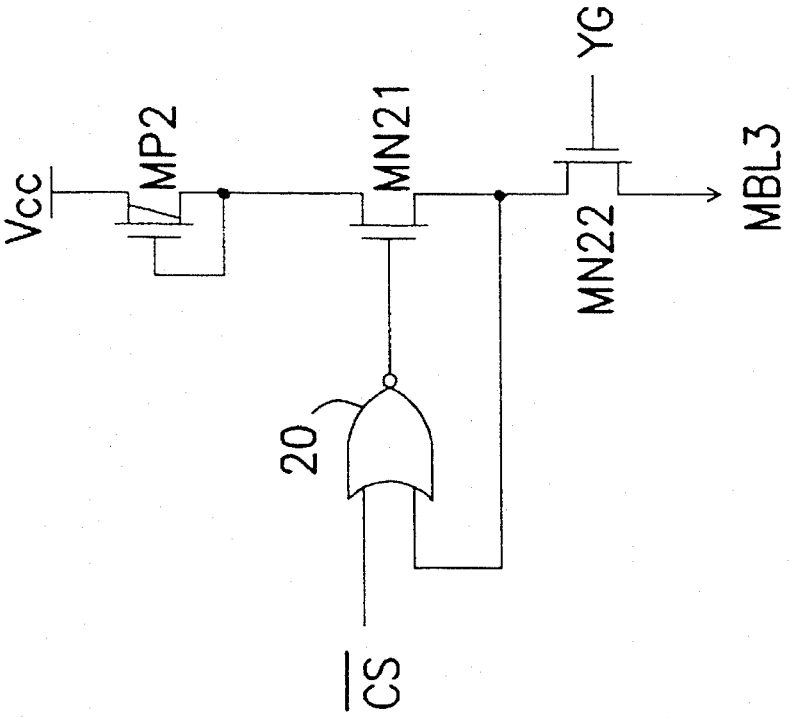
FIG. 2B illustrates a clamp circuit for the ROM bank of FIG. 1.
Figure 2A:
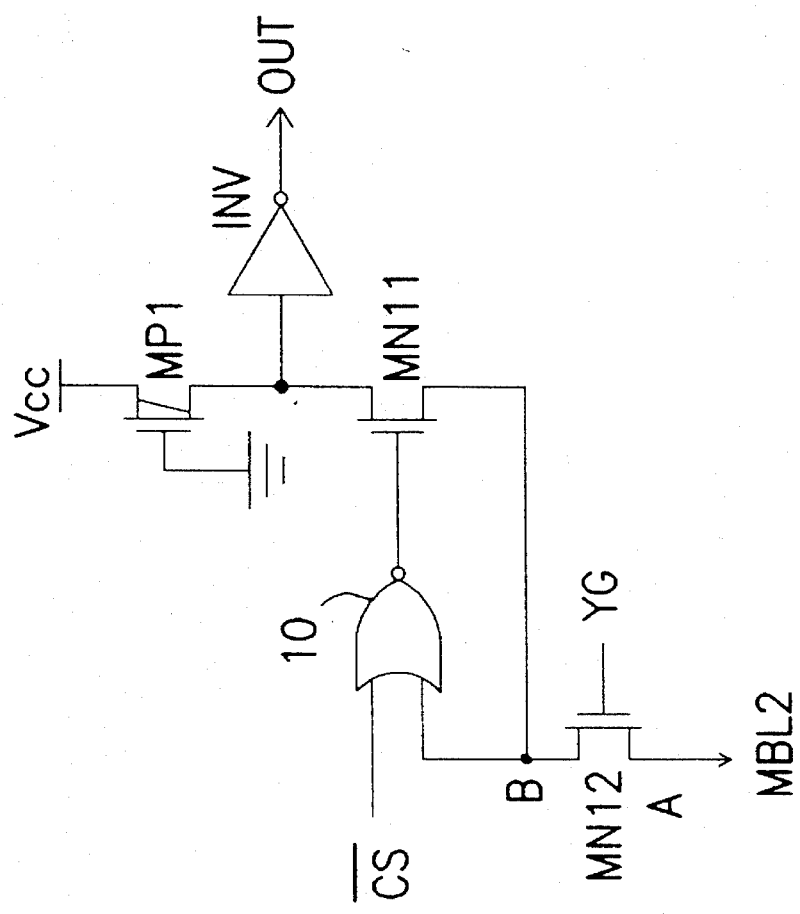
FIG. 2A illustrates a sense amplifier for the ROM bank of FIG. 1.
Figure 3:
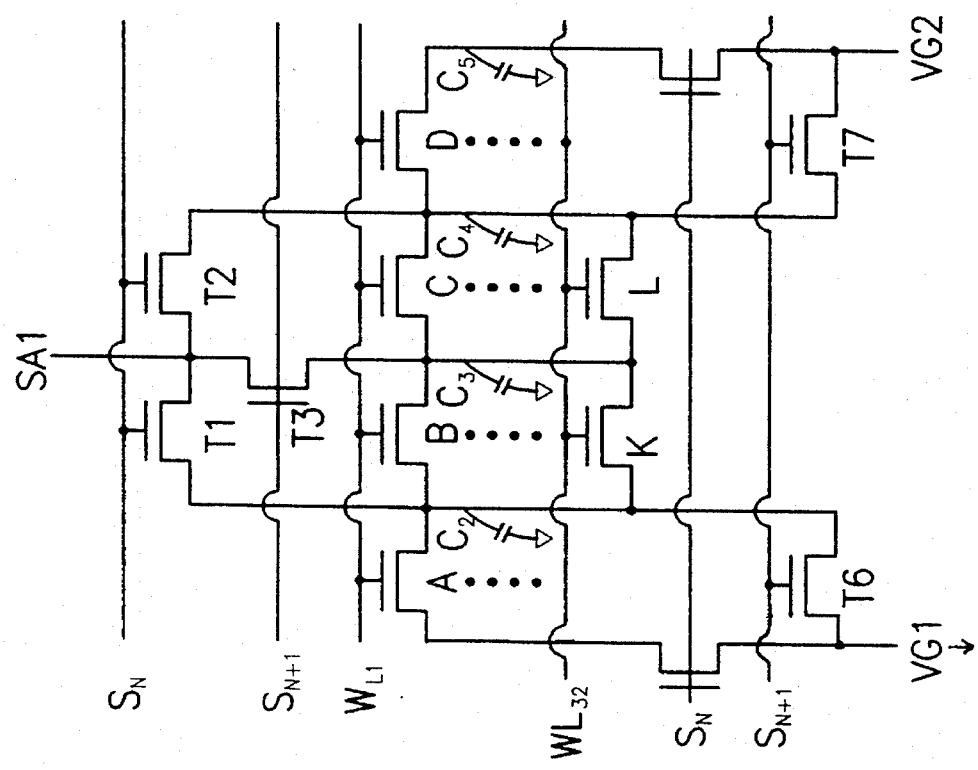
FIG. 3 is a schematic diagram of a reduced memory bank structure.
Figure 4:
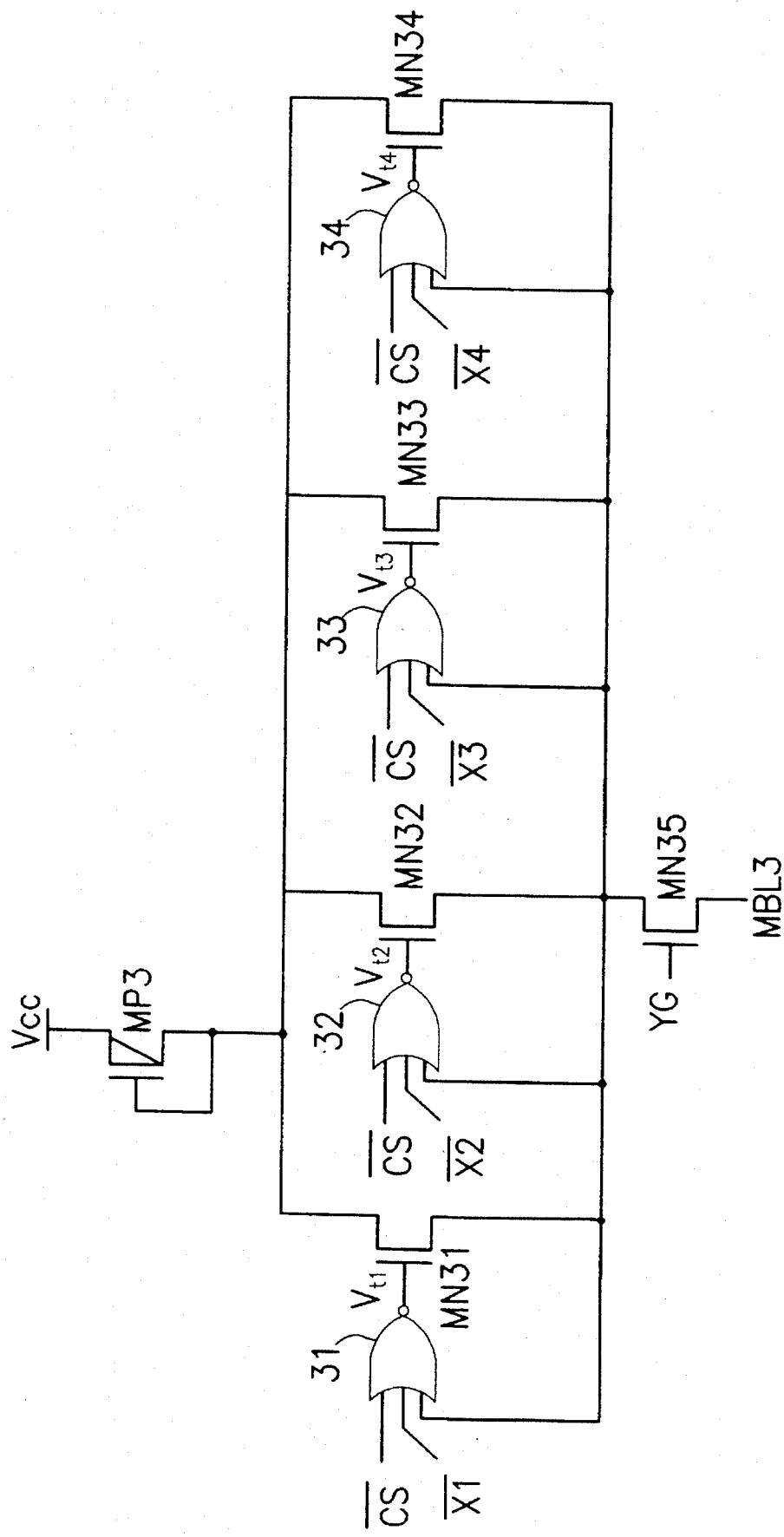
FIG. 4 illustrates a clamp circuit according to a preferred embodiment of the present invention.

FIG. 4 is a circuit diagram of the clamp circuit according to one preferred embodiment of the present invention. Referring to FIG. 4, the clamp circuit includes an active load MP3, a plurality of amplifiers and a transmission gate MN35. Active load MP3, consisting essentially of a transistor, is connected to a voltage source Vcc. The amplifiers are connected in parallel to active load MP3 and provide various clamp voltages to a word line MBL3 through transmission gate MN35. For the arrangement of word line MBL3 in the ROM bank structure, please refer to FIG. 1.

Active load MP3 can be a P-type MOS field effect transistor. As shown in the figure, since the drain and gate terminals are connected together and the source terminal is connected to voltage source Vcc, the channel of transistor MP3 is normally turned on to conduct current from the source terminal to the drain terminal.

Each amplifier can be composed of an invertor and an N-type MOS field effect transistor. For example, the first amplifier is composed of invertor 31 (or preferably a NOR gate for providing more input terminals), and transistor MN31. The gate of transistor MN31 is controlled by NOR gate 31. The drain of transistor MN31 is connected to the drain terminal of active load MP3. The source of transistor MN31 forms a feedback loop to connect one input terminal of NOR gate 31. NOR gate 31 is also controlled by a chip select signal CS and a decoding signal X1 at its input ends. These signals can enable the amplifier to generate a clamp voltage at the source terminal of transistor MN31.

In the present invention, other amplifiers, composed of NOR gates 32–34 and transistors MN32–MN34, are also controlled by the common chip select signal CS but by different decoding signals X2–X4. The source terminals of transistors MN31, MN32, MN33 and MN34 are connected together to transmission gate MN35, thus connecting all the amplifiers in parallel. Since each amplifier is controlled by a different decoding signal, and only one decoding signal can be active to enable the generation of clamp voltage, only one clamp voltage comes from the amplifiers to transmission gate MN35. The clamp voltage is then provided to word line MBL3 through transmission gate MN35. In the present invention, transmission gate MN35 is controlled by a column select signal YG and consists essentially of a transistor, such as the NMOS transistor shown in FIG. 4.

Figure 5:
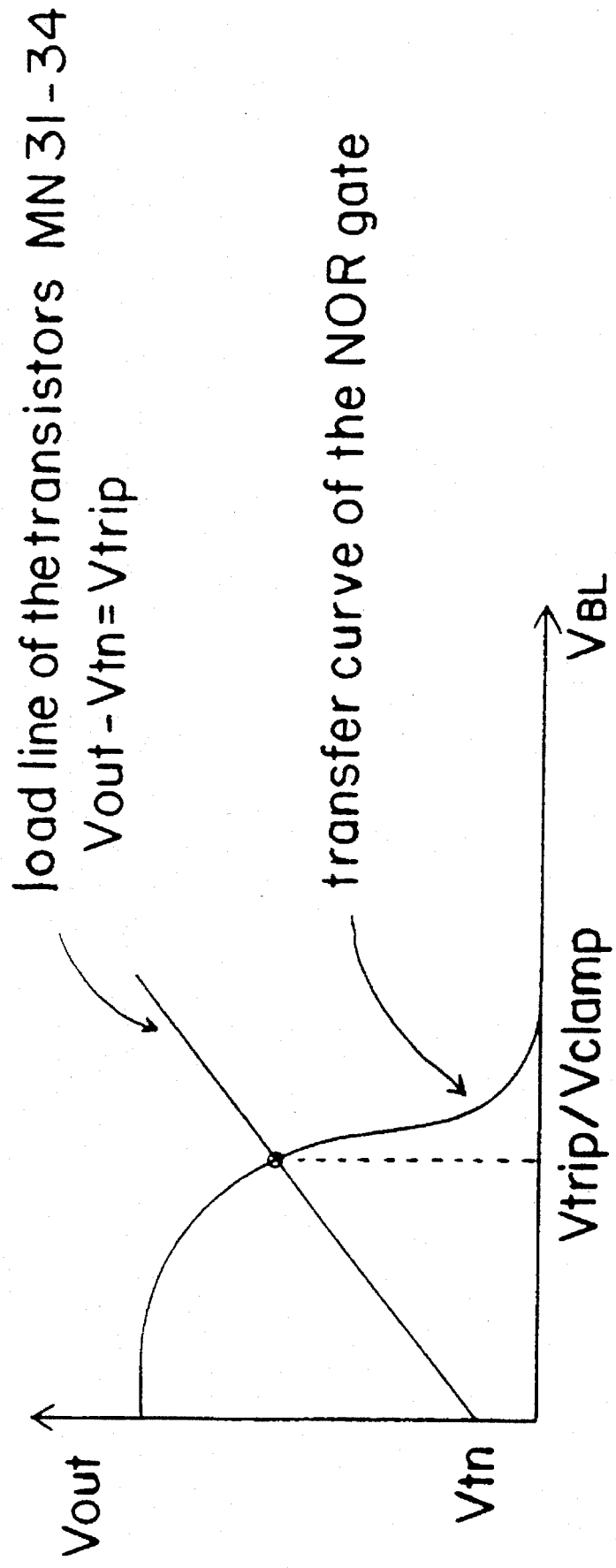
FIG. 5 is a graph depicting NOR gate output voltage versus bit line voltage based upon NOR gate transfer curve and transistor load line.

Referring briefly to FIG. 5, one skilled in the art can appreciate the relationship of the NOR gate output voltage ($V_{OUT}$) and bit line voltage ($V_{BL}$) through the transfer curve of the NOR gate and the load line of the transistors MN31–MN34. The trip voltage and clamp voltage will have the same value, and will be the highest voltage that the bit line can achieve. As can be seen, when the bit line voltage rises up to the trip voltage, the NOR gate output voltage will turn off the transistors and the bit line voltage will not be able to rise anymore. The gate output voltage less the transistor threshold voltage will equal the trip voltage ($V_{OUT} - V_{TN} = V_{TRIP}$). Therefore, in order to provide various clamp voltages to different memory cells in the ROM bank, the trip voltages of the amplifiers have to be set to different values. Since the NOR gates (or invertors) are composed of a number of transistors in a Semiconductor integrated circuit, the trip voltages can be easily set to desired values by properly defining the channel length and width ratios of the transistors. This task is consistent with the design of NOR gate layout patterns, with no additional complicated process being introduced into the fabrication methodology of the semiconductor integrated circuit.

Since the clamp circuit depicted in FIG. 4 consists of four amplifiers, four different clamp voltages can be provided to the memory cells of the ROM device. For example, the ROM device can consist of thirty-two word lines $W_{L1}$ through $W_{L32}$ which are decoded from decoding signals X1 through X4. That is, word lines $W_{L1}$ through $W_{L8}$ are decoded from signal X1, word lines $W_{L9}$ through $W_{L16}$ are decoded from signal X2, word lines $W_{L17}$ through $W_{L24}$ are decoded from signal X3, and word lines $W_{L25}$ through $W_{L32}$ are decoded from signal X4. As mentioned above, each word line controls a number of memory cells whose data path to the sense amplifier has an effective resistance depending on the position of the word line in the bank. In the present invention, trip voltages of the four amplifiers are $V_{t1}$, $V_{t2}$, $V_{t3}$ and $V_{t4}$ and have an relationship of $V_{t1} > V_{t2} > V_{t3} > V_{t4}$. When the farthest word lines from the clamp circuit (e.g., $W_{L1} - W_{L8}$) are selected, clamp voltage $V_{t1}$ is provided by the first amplifier to the word lines. Since the first amplifier is the only amplifier enabled by decoding signal X1, and its clamp voltage $V_{t1}$ has the highest value among all the clamp voltages, the high effective resistance of the data path can be compensated by clamp voltage $V_{t1}$. Similarly, if other nearer word lines are selected, the lower clamp voltages $V_{t2}$, $V_{t3}$ and $V_{t4}$ can be provided to word lines $W_{L9} - W_{L16}$, $W_{L17} - W_{L24}$ and $W_{L25} - W_{L32}$, respectively, to compensate for the lower effective resistance of their data paths. Therefore, the parasitic capacitance can be uniformly offset and the performance of the ROM device can be improved.

Though the clamp circuit according to the preferred embodiment of the present invention consists of four amplifiers to provide four different clamp voltages, greater or fewer numbers of amplifiers and clamp voltages can be utilized in the clamp circuit. For example, in order to compensate the effective resistance more precisely, eight amplifiers for eight clamp voltages are suitable for application in the ROM device. Or if less circuit area is required, two amplifiers for only two clamp voltages are also allowable. Therefore, the above description of the preferred embodiment of the present invention is employed for the purposes of description, not to restrict the scope of the present invention. Modifications to the outlined embodiment of the present invention will be apparent to those skilled in the art and should be considered to be within the scope of the present invention as recited in the claims which follow.

What is claimed is:

1. A clamp circuit for providing clamp voltages to a plurality of word lines of a read-only-memory (ROM) device, comprising:

an active load;

a plurality of amplifiers of various trip voltages connected in parallel to said active load, each of said plurality of amplifiers being controlled by one of a plurality of decoding signals for providing one of said clamp voltages; and a transmission gate, connected to said amplifiers, for providing said clamp voltages to said word lines.

2. The clamp circuit of claim 1, wherein said each of said plurality of amplifiers includes a NOR gate and a transistor, said NOR gate having an input terminal controlled by one of said plurality of decoding signals, said transistor having a gate terminal controlled by an output of said NOR gate, a drain terminal connecting to a voltage source, and a source terminal forming a feedback to another input of said NOR gate.

3. The clamp circuit of claim 2, wherein said NOR gate has an input terminal controlled by a chip select signal.

4. The clamp circuit of claim 2, wherein said trip voltage of said amplifier is determined by a layout structure of said NOR gate.

5. The clamp circuit of claim 1, wherein said active load includes a transistor.

6. The clamp circuit of claim 1, wherein said plurality of amplifiers includes four amplifiers providing four trip voltages $V_{t1}$, $V_{t2}$, $V_{t3}$ and $V_{t4}$ to thirty-two word lines $W_{L1}$–$W_{L32}$, said clamp voltages having a relationship of $V_{t1} > V_{t2} > V_{t3} > V_{t4}$, said clamp voltage $V_{t1}$ being provided to said word lines $W_{L1}$–$W_{L8}$ farthest from said clamp circuit, and said clamp voltages $V_{t2}$, $V_{t3}$ and $V_{t4}$ being provided to said word lines $W_{L9}$–$W_{L16}$, $WL_{17}$–$W_{L24}$ and $W_{L25}$–$W_{L32}$, respectively.

7. The clamp circuit of claim 1, wherein said transmission gate includes a transistor.

* * * * *